(12) United States Patent
Kim

(10) Patent No.: US 8,750,027 B2
(45) Date of Patent: Jun. 10, 2014

(54) SRAM DEVICES AND METHODS OF MANUFACTURING THE SAME

(71) Applicant: Samsung Electronics Co., Ltd., Sunwon-Si (KR)

(72) Inventor: Yongshik Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/048,837

(22) Filed: Oct. 8, 2013

(65) Prior Publication Data

US 2014/0027839 A1      Jan. 30, 2014

Related U.S. Application Data

(62) Division of application No. 13/151,834, filed on Jun. 2, 2011, now Pat. No. 8,576,613.

(30) Foreign Application Priority Data

Jun. 8, 2010   (KR) ........................ 10-2010-0054023

(51) Int. Cl.
   *G11C 11/00*      (2006.01)
(52) U.S. Cl.
   USPC ............................ 365/156; 365/154; 365/173
(58) Field of Classification Search
   USPC .......... 365/156, 154, 171, 172, 173; 327/302, 327/331, 333, 351, 393
   See application file for complete search history.

(56) References Cited

U.S. PATENT DOCUMENTS

| 6,670,642 B2 | 12/2003 | Takaura et al. |
| 7,052,941 B2 | 5/2006 | Lee |
| 7,378,702 B2 | 5/2008 | Lee |
| 2004/0262635 A1 | 12/2004 | Lee |
| 2005/0280061 A1 | 12/2005 | Lee |
| 2006/0172483 A1 | 8/2006 | Forbes |
| 2008/0062756 A1 | 3/2008 | Mayor et al. |

FOREIGN PATENT DOCUMENTS

| KR | 20000008693 A | 2/2000 |
| KR | 20020096808 A | 12/2002 |
| KR | 100374074 | 7/2003 |
| KR | 20040008453 A | 1/2004 |
| KR | 20050003326 A | 1/2005 |
| KR | 100831274 | 5/2008 |
| KR | 100866734 | 11/2008 |
| WO | WO-9633513 A1 | 10/1996 |

OTHER PUBLICATIONS

Soon-Moon Jung et al., "Highly Cost Effective and High Performance 65nn S3 (Stacked Single-crystal Si) SRAM Technology with $25F^2$, $0.16um^2$ Cell and Doubly Stacked SSTFT Cell Transistors for Ultra High Density and High Speed Applications", VLSI Technology, 2005, Digest of Technical Papers, 2005 Symposium on Jun. 14-16, 2005, pp. 220-221.

*Primary Examiner* — Richards Elms
*Assistant Examiner* — Hien Nguyen
(74) *Attorney, Agent, or Firm* — Harness, Dickey & Pierce, P.L.C.

(57) ABSTRACT

Example embodiments relate to an SRAM device and a method of manufacturing the same. The SRAM device may include first transistors operating in a horizontal direction and second transistors that are disposed on the first transistors to operate in a vertical direction. In example embodiments, the second transistors may be vertically connected to the first transistors. In example embodiments, the second transistors may be vertical transistors that include vertical gates surrounding vertical channels.

5 Claims, 26 Drawing Sheets

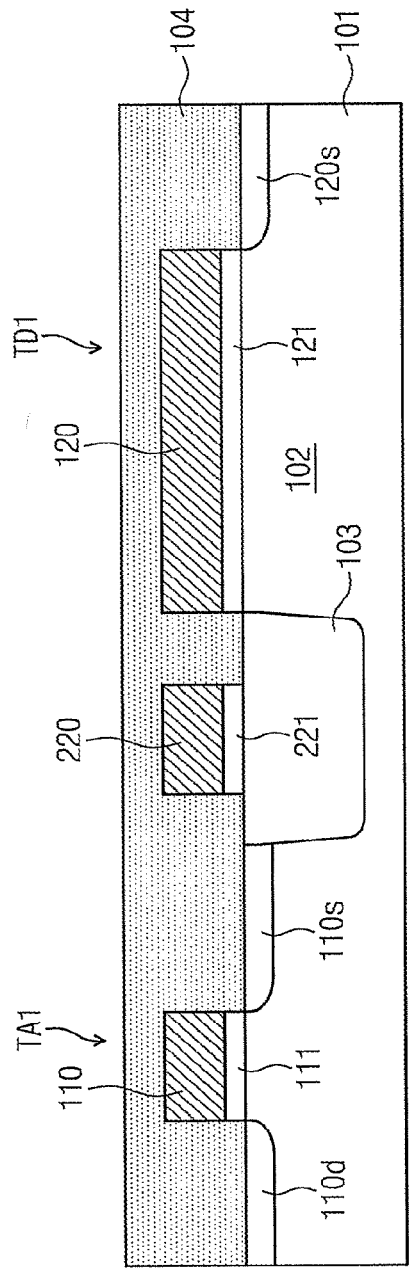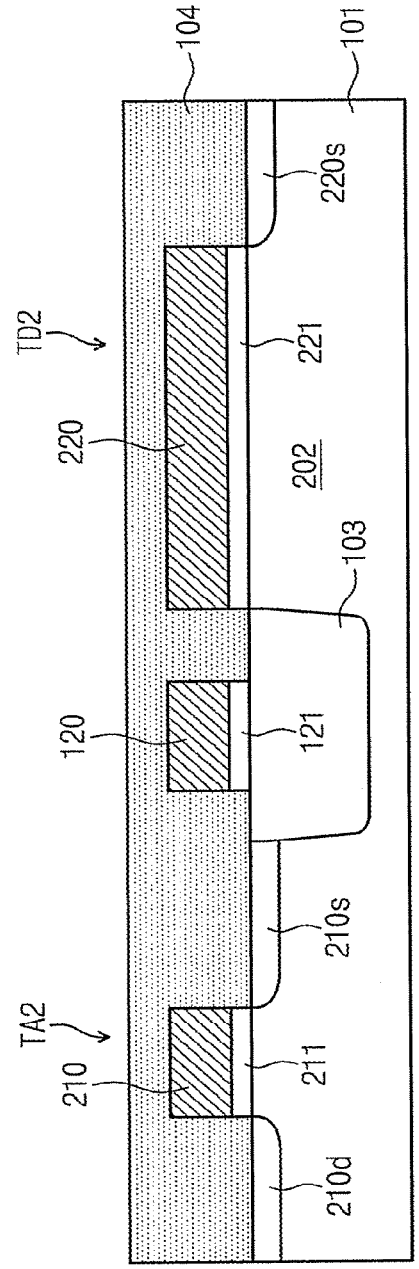

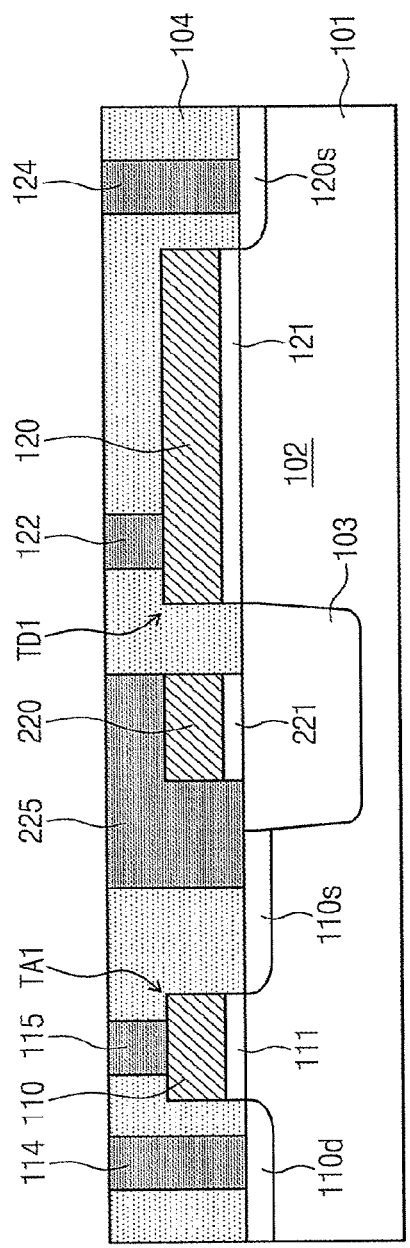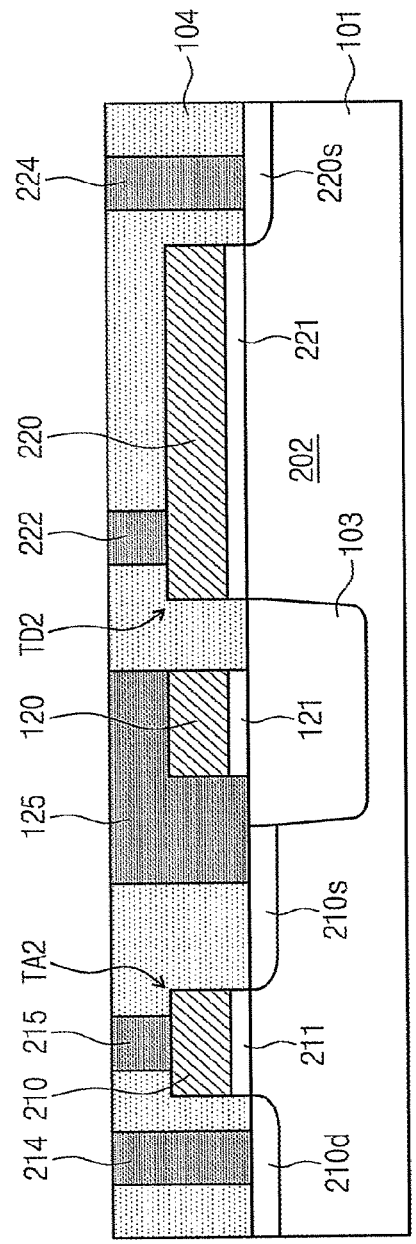

SRAM DEVICES AND METHODS OF MANUFACTURING THE SAME

CROSS-REFERENCE TO RELATED APPLICATIONS

This U.S. non-provisional patent application is a divisional application of U.S. application Ser. No. 13/151,834, filed on Jun. 2, 2011, which claims priority under 35 U.S.C. §119 to Korean Patent Application No. 10-2010-0054023, filed on Jun. 8, 2010, in the Korean Intellectual Property Office (KIPO), the entire contents of both of which are hereby incorporated by reference.

BACKGROUND

1. Field

Example embodiments of the inventive concepts relate to semiconductors, and more particularly, to SRAM devices and methods of manufacturing the same.

2. Description of the Related Art

An SRAM device, like a DRAM device, is a volatile device that cannot maintain stored data without power. The SRAM device is a random access memory device that can access any location. Unlike the DRAM device, the SRAM device is a static device that doesn't need a refresh and is advantageous in operation speed and power consumption compared with the DRAM device. The SRAM device is being widely used in a portable electronic device like a cache memory or a cell phone.

SUMMARY

In accordance with example embodiments, an SRAM device may include first transistors and second transistors on the first transistors. The first transistors may be configured to operate in a horizontal direction and the second transistors may be configured to operate in a vertical direction. In example embodiments, the second transistors may be vertically connected to the first transistors. Furthermore, the second transistors may be vertical transistors that include vertical gates and vertical channels surrounded by the vertical gates.

In accordance with example embodiments, a method of manufacturing an SRAM device may include forming first transistors on a first substrate such that the first transistors operate in a horizontal direction. The method may further include implanting impurities on a second substrate to form semiconductor layers on the second substrate, attaching the second substrate to the first substrate to stack the semiconductor layers on the first substrate, patterning the semiconductor layers to form vertical pillars, and forming conductive layers surrounding the vertical pillars to form second transistors vertically connected to the first transistors. In example embodiments, the second transistors may be configured to operate in a vertical direction and may constitute an inverter circuit together with the first transistors.

In accordance with example embodiments an SRAM device may include a first access transistor, a second access transistor, a first driver transistor, and a second driver transistor on a first substrate. The SRAM device may further include a first load transistor on the second driver transistor and a second load transistor on the first driver transistor. In example embodiments the SRAM device may further include a first shared contact electrically connecting a gate of the first load transistor to a source of the second access transistor and electrically connecting the gate of the first load transistor to a gate of the first driver transistor may be provided. In example embodiments the SRAM device may further include a second shared contact electrically connecting a gate of the second load transistor to a source of the first access transistor and electrically connecting the gate of the second load transistor to a gate of the second driver transistor. In example embodiments the SRAM device may further include a first contact between the second load transistor and a gate of the first driver transistor to electrically connect the second load transistor to the first driver transistor, and a second contact between the first load transistor and a gate of the second driver transistor to electrically connect the first load transistor to the second driver transistor. In example embodiments, the first access transistor, the second access transistor, the first driver transistor, and the second driver transistor may be configured to operate horizontally and the first and second load transistors may be configured to operate vertically.

Example embodiments of the inventive concepts provide an SRAM device. The SRAM device may include first transistors operating in a horizontal direction and second transistors disposed on the first transistors to operate in a vertical direction vertically connected to the first transistors. The second transistors are vertical transistors that vertical gates surround vertical channels.

Example embodiments of the inventive concepts also provide an SRAM device. The SRAM device may include first and second access transistors: and first and second inverters constituting a latch circuit between the first and second access transistors. The first inverter comprises a first driver transistor and a first load transistor serially connected to each other and the second inverter comprises a second driver transistor and a second load transistor serially connected to each other. The first and second load transistors are vertical transistors such that the first and second load transistors are stacked on the first and second driver transistors to be vertically connected to the first and second driver transistors, respectively.

Example embodiments of the inventive concepts also provide a method of manufacturing an SRAM device. The method may include forming first transistors operating in a horizontal direction on a first substrate; forming semiconductor layers on a second substrate by implanting impurities; stacking the semiconductor layers on the first substrate by attaching the second substrate to the first substrate; forming vertical pillars by patterning the semiconductor layers; and forming second transistors operating in a vertical direction vertically connected to the first transistors by forming conductive layers surrounding the vertical pillars, the second transistors constituting an inverter circuit together with the first transistors.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the figures:

FIGS. 6A through 12A are top plan views illustrating a method of manufacturing an SRAM device in accordance with example embodiments of the inventive concepts.

FIGS. 6B through 12B are cross-sectional views taken along the line C-C' of FIGS. 6A through 12A.

FIGS. 6C through 12C are cross-sectional views taken along the line D-D' of FIGS. 6A through 12A.

DETAILED DESCRIPTION OF EXAMPLE EMBODIMENTS

Figure 1:
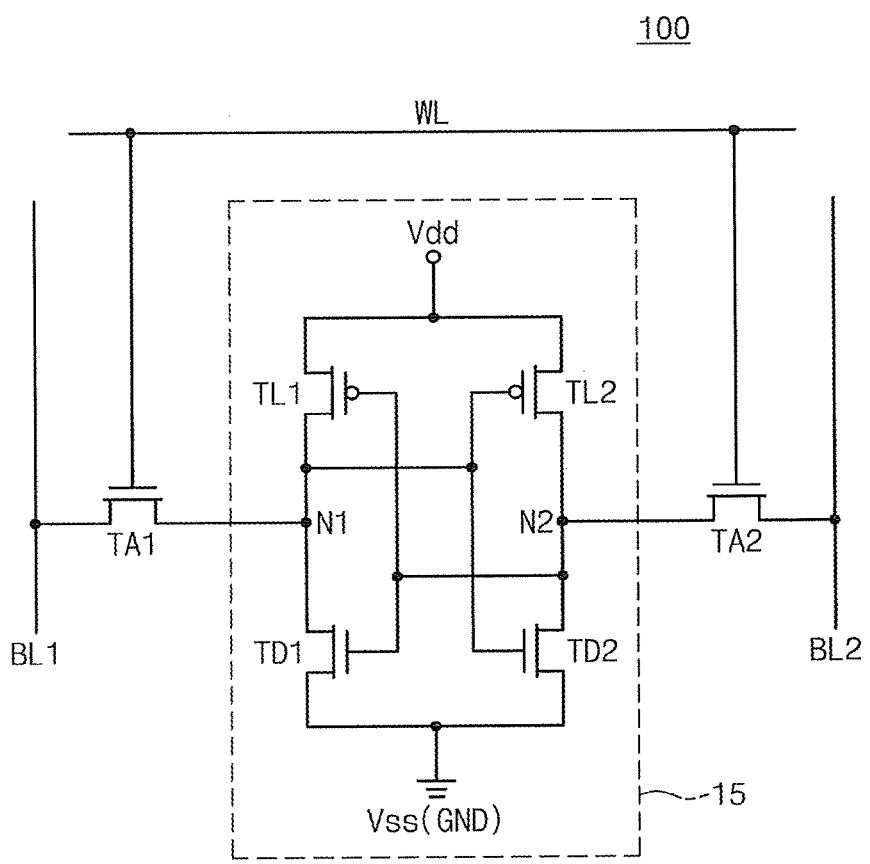
FIG. 1 is an equivalent circuit diagram illustrating an SRAM device in accordance with example embodiments of the inventive concepts.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the inventive concepts will be described below in more detail with reference to the accompanying drawings. Example embodiments of the inventive concepts may, however, be embodied in different forms and should not be construed as limited to example embodiments as set forth herein. Rather, example embodiments are provided so that this disclosure will be thorough and complete, and will fully convey the scope of the inventive concepts to those skilled in the art. Like numbers refer to like elements throughout.

FIG. 1 is an equivalent circuit diagram illustrating an SRAM device in accordance with example embodiments of the inventive concepts.

Referring to FIG. 1, an SRAM device 100 may include a latch circuit 15 and two access transistors TA1 and TA2. The latch circuit 15 includes a first inverter such that a first load transistor TL1 and a first driver transistor TD1 are serially connected to each other through a first node N1 and a second inverter such that a second load transistor TL2 and a second driver transistor TD2 are serially connected to each other through a second node N2. An input of the first inverter is connected to an output of the second inverter and an input of the second inverter is connected to an output of the first inverter.

For example, the first driver transistor TD1 and the first access transistor TA1 may be serially connected to each other. A source of the first driver transistor TD1 may be connected to a ground line Vss and a drain of the first access transistor TA1 may be connected to a first bit line BL1. Similarly, the second driver transistor TD2 and the second access transistor TA2 may be serially connected to each other. A source of the second driver transistor TD2 may be connected to the ground line Vss and a drain of the second access transistor TA2 may be connected to a second bit line BL2. A source and a drain of the first load transistor TL1 may be connected to a power supply line Vdd and a drain of the first driver transistor TD1, respectively. Similarly, a source and a drain of the second load transistor TL2 may be connected to the power supply line Vdd and a drain of the second driver transistor TD2, respectively.

A source of the first access transistor TA1, the drain of the first driver transistor TD1 and the drain of the first load transistor TL1 may correspond to the first node N1. Similarly, a source of the second access transistor TA2, the drain of the second driver transistor TD2 and the drain of the second load transistor TL2 may correspond to the second node N2. A gate of the first driver transistor TD1 and a gate of the first load transistor TL1 may be connected to the second node N2, and a gate of the second driver transistor TD2 and a gate of the second load transistor TL2 may be connected to the first node N1. A gate of the first access transistor TA1 and a gate of the second access transistor TA2 may be connected to a word line WL.

According to example embodiments, the access transistors TA1 and TA2 and the driver transistors TD1 and TD2 may be NMOS transistors formed in a bulk silicon substrate, and the load transistors TL1 and TL2 may be PMOS transistors formed in a stack silicon wafer stacked on the bulk silicon wafer. The bulk silicon wafer and the stack silicon wafer may be connected to each other through a contact or a via.

The NMOS transistors TA1, TA2, TD1 and TD2 may be horizontal transistors that operate horizontally and the PMOS transistors TL1 and TL2 may be vertical transistors that operate vertically. In example embodiments, terms of "operate horizontally" and "horizontal transistor" mean that a main flow of main current is a horizontal direction, and terms of "operate vertically" and "vertical transistor" mean that a main flow of main current is a vertical direction. According to example embodiments, the PMOS transistors TL1 and TL2 are vertical transistors including vertical channels that operate vertically. In the vertical transistor, a source and a drain may be formed on a top and a bottom of the vertical channel, respectively, and a gate may be a shape surrounding the vertical channel. A vertical surround gate can greatly improve a shot channel effect compared with a horizontal gate, thereby electrical characteristics of a transistor can be improved. The NMOS transistors TA1, TA2, TD1 and TD2 may be horizontal transistors including horizontal channels that operate horizontally.

Figure 2:
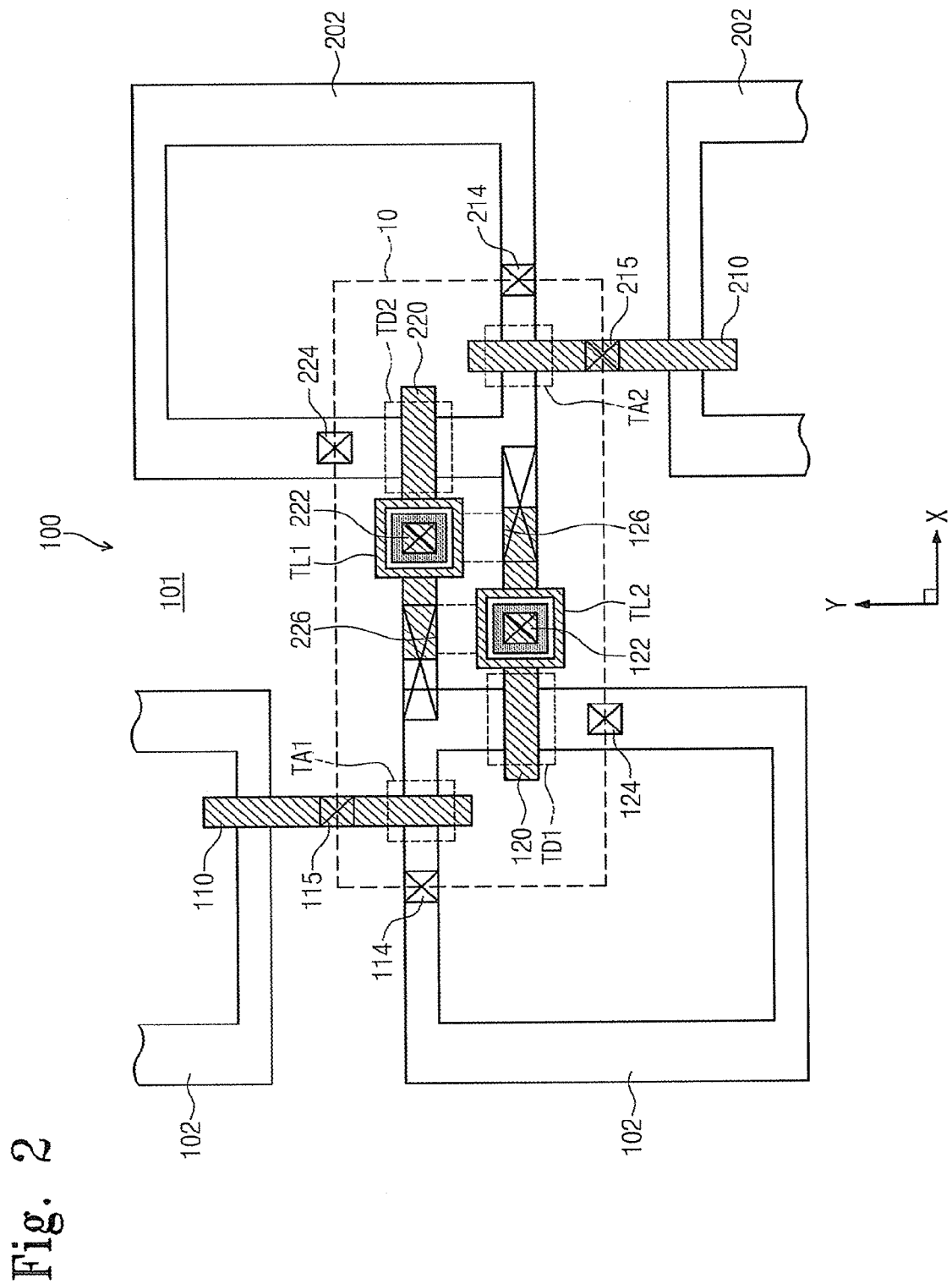
FIG. 2 is a layout illustrating an SRAM device in accordance with example embodiments of the inventive concepts.

FIG. 2 is a layout illustrating an SRAM device in accordance with example embodiments of the inventive concepts.

Referring to FIG. 2, the SRAM device 100 may have a stacked structure such that among six transistors constituting a unit cell 10, four NMOS transistors TA1, TA2, TD1 and TD2 are formed on a substrate 101 such as the bulk silicon wafer and the rest two PMOS transistors TL1 and TL2 are formed over the substrate 101. The stacked structure will be described in detail later. The PMOS transistors are not formed on the substrate 101 but are stacked over the substrate 101, which may improve integration.

For example, the substrate 101 may include a first active region 102 and a second active region 202 that can be distinct from each other. The active regions 102 and 202 may be defined by forming a device isolation layer in the substrate 101. The active regions 102 and 202 may have a band structure of square shape. Two first gates 110 and 210 parallel to each other extend in a Y direction on the substrate 101. Overlap portions of the first and second active regions 102 and 202 and the two first gates 110 and 210 may define a first access transistor TA1 and a second access transistor TA2, respectively. Alternatively, two second gates 120 and 220 parallel to each other extend in an X direction on the substrate 101. Overlap portions of the first and second active regions 102 and 202 and the two second gates 120 and 220 may define a first driver transistor TD1 and a second driver transistor TD2, respectively.

For convenience's sake, the first gate 110 of the first access transistor TA1 may be referred to as a first access gate and the first gate 210 of the second access transistor TA2 may be referred to as a second access gate. Similarly, the second gate 120 of the first driver transistor TD1 may be referred to as a first driver gate and the second gate 220 of the second driver transistor TD2 may be referred to as a second driver gate.

Referring to FIGS. 1 and 2, the first access gate 110 may be connected to the word line WL through a first word line contact 115. The second access gate 210 may be connected to the word line WL through a second word line contact 215. That is, the first access transistor TA1 and the second access transistor TA2 may be connected to the same word line WL. The drain of the first access transistor TA1 may be connected to the first bit line BL1 through a first bit line contact 114 and the drain of the second access transistor TA2 may be connected to the second bit line BL2 through a second bit line contact 214. The source of the first driver transistor TD1 may be connected to the ground line Vss through a first ground line contact 124 and the source of the second driver transistor TD2 may be connected to the ground line Vss through a second ground line contact 224. That is, the first drive transistor TD1 and the second driver transistor TD2 may be connected to the same ground line Vss. The first load transistor TL1 may be formed on the second driver gate 220 and may be serially connected to the first driver transistor TD1 through a first serial via 126 to constitute an inverter. Similarly, the second load transistor TL2 may be formed on the first driver gate 120 and may be serially connected to the second driver transistor TD2 through a second serial via 226 to constitute another inverter.

Figure 3:
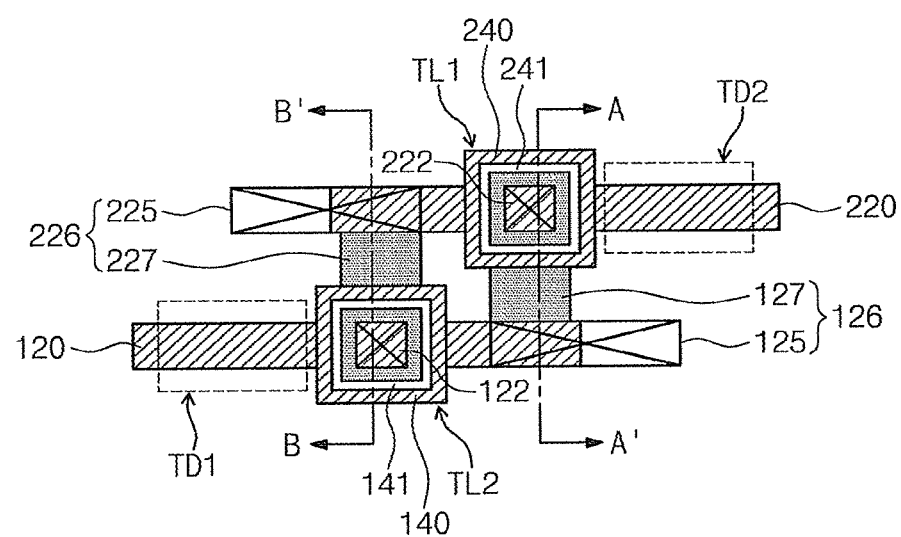
FIG. 3 is a top plan view illustrating a portion of unit cell of an SRAM device in accordance with example embodiments of the inventive concepts.
Figure 4:
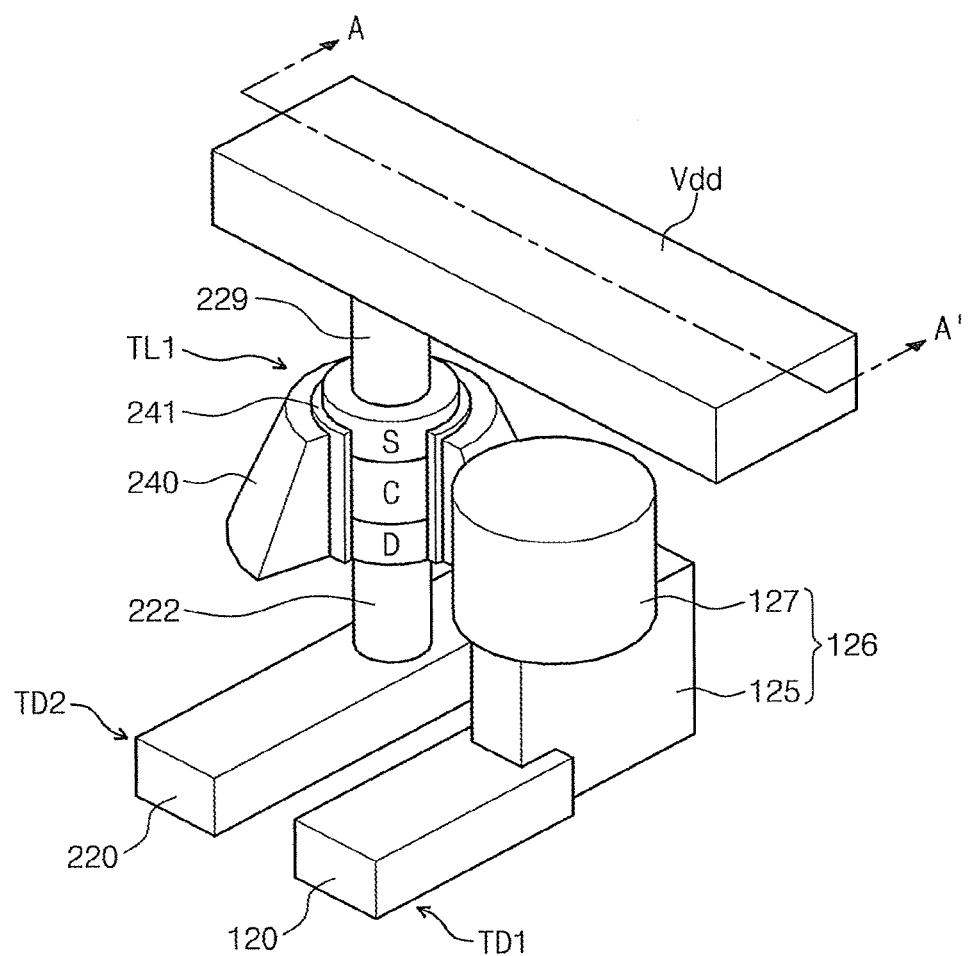
FIGS. 4 and 5 are perspective views illustrating a portion of FIG. 3.
Figure 5:
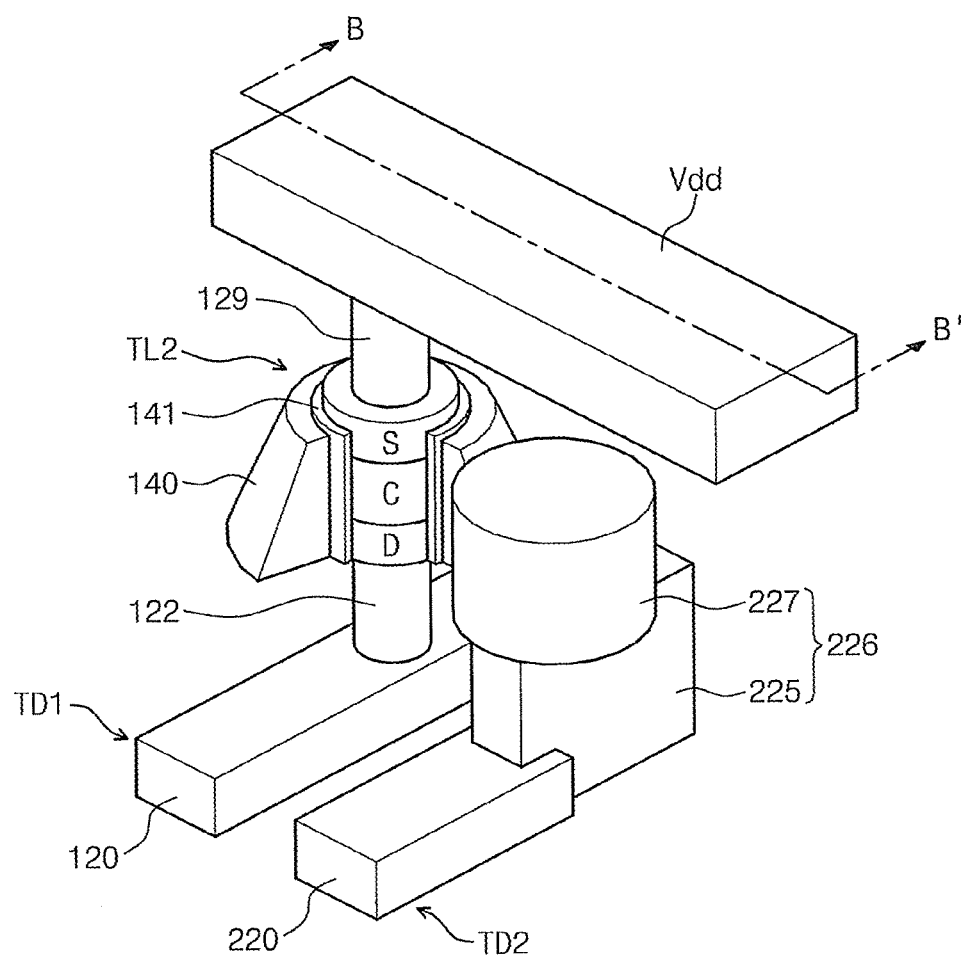

FIG. 3 is a top plan view illustrating a portion of unit cell of an SRAM device in accordance with example embodiments of the inventive concepts. FIGS. 4 and 5 are perspective views illustrating a portion of FIG. 3.

Referring to FIGS. 3 and 4, the first load transistor TL1 may be a vertical channel PMOS structure. For instance, the vertical channel PMOS structure may include a P-type source S and a P-type drain D formed on a top and a bottom of a channel C of a vertical pillar shape, respectively and a gate insulating layer 241 and a gate 240 surrounding the vertical channel C. The gate 240 may be a surround gate structure and may be formed to have a spacer shape of which width is gradually widen as going downward. In the first load transistor TL1, the drain D formed on the bottom of the vertical channel C may be connected to the second driver gate 220 through a second contact 222 and the gate 240 may be connected to the first driver gate 120 through the first serial via 126. Thus, the first load transistor TL1 may be serially connected to the first driver transistor TD1 to form an inverter. The first serial via 126 may include a first shared contact 125 and a first via 127. The first shared contact 125 may be connected to the first gate driver 120 and the source of the second access transistor (TA2 of FIG. 2) in common and the first via 127 may connect the first shared contact 125 to the gate 240 of the first load transistor TL1. The source S of the first load transistor TL1 may be connected to the power supply line Vdd through a first power supply contact 229.

Referring to FIGS. 3 and 5, the second load transistor TL2 may be a vertical channel PMOS structure. For instance, the vertical channel PMOS structure may include a P-type source S and a P-type drain D formed on a top and a bottom of a channel C of a vertical pillar shape, respectively and a gate insulating layer 141 and a gate 140 surrounding the vertical channel C. The gate 140 may be a surround gate structure and may be formed to have a spacer shape of which width is gradually widen as going downward. In the second load transistor TL2, the drain D formed on the bottom of the vertical channel C may be connected to the first driver gate 120 through a first contact 122 and the gate 140 may be connected to the second driver gate 220 through a second serial via 226. Thus, the second load transistor TL2 may be serially connected to the second driver transistor TD2 to form another inverter. The second serial via 226 may include a second shared contact 225 and a second via 227. The second shared contact 225 may be connected to the second gate driver 220 and the source of the first access transistor (TA1 of FIG. 2) in common and the second via 227 may connect the second shared contact 225 to the gate 140 of the second load transistor TL2. The source S of the second load transistor TL2 may be connected to the power supply line Vdd through a second power supply contact 129.

FIGS. 6A through 12A are top plan views illustrating a method of manufacturing an SRAM device in accordance with example embodiments of the inventive concepts. FIGS. 6B through 12B are cross-sectional views taken along the line C-C' of FIGS. 6A through 12A. FIGS. 6C through 12C are cross-sectional views taken along the line D-D' of FIGS. 6A through 12A. FIG. 10D is a top plan view illustrating a portion of FIG. 10A. FIG. 11D is a top plan view illustrating a portion of FIG. 11A.

Figure 6A:
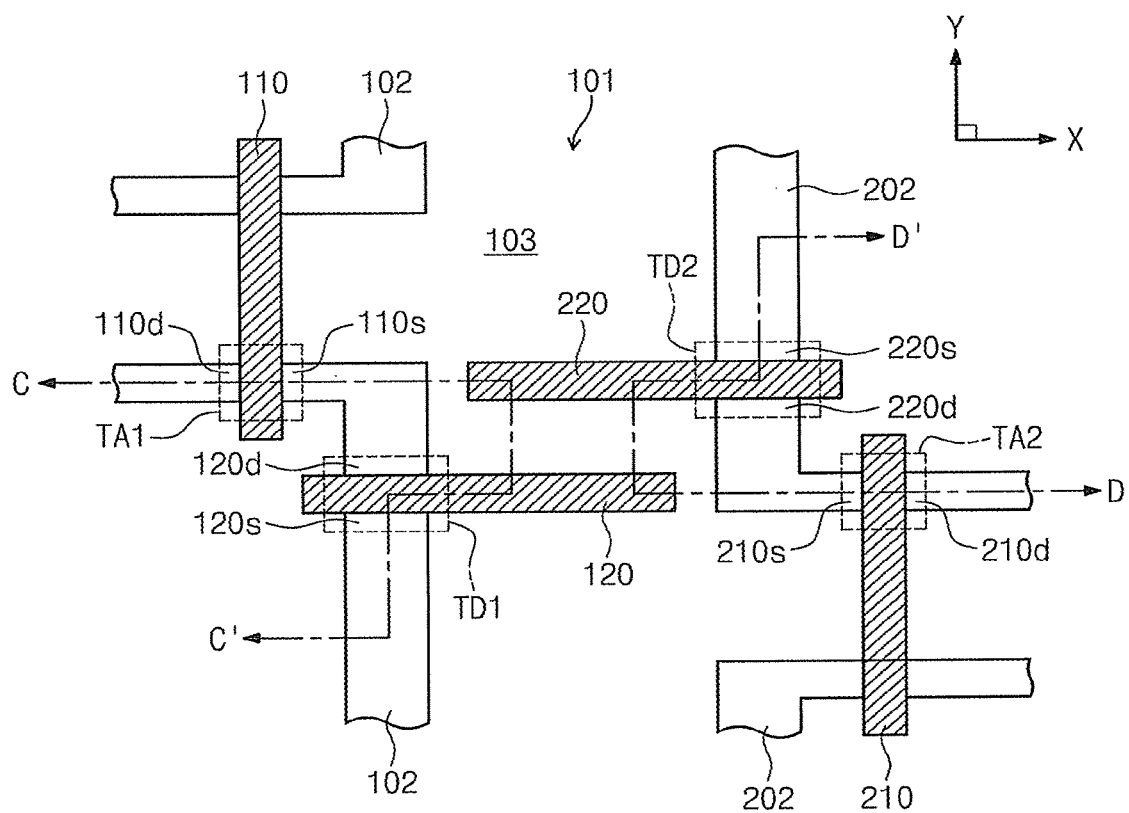

Referring to FIGS. 6A, 6B and 6C, a device isolation layer 103 may be formed in a substrate 101 to define a first active region 102 and a second active region 202. The substrate 101 may be a bulk silicon wafer. After depositing an insulating layer and a conductive layer on the substrate 101, gate insulating layers and gates may be formed by patterning the insulating layer and the conductive layer. N-type impurities may be implanted into the active regions 102 and 202 to form junction regions, thereby forming NMOS transistors TA1, TA2, TD1 and TD2. Subsequently, a first interlayer insulating layer 104 covering the NMOS transistors TA1, TA2, TD1 and TD2 may be formed.

For example, a first access gate 110 and a second access gate 210 may be formed to extend in a Y direction. The first and second access gates 110 and 210 may be parallel to each other. A first driver gate 120 and a second driver gate 220 may be formed to extend in an X direction substantially perpendicular to the Y direction. The first and second driver gates 120 and 220 may be parallel to each other. The first access gate 110 may constitute a first access transistor TA1 together with a gate insulating layer 111, a source 110s and a drain 110d. The second access gate 210 may constitute a second access transistor TA2 together with a gate insulating layer 211, a source 210s and a drain 210d.

Similarly, the first driver gate 120 may constitute a first driver transistor TD1 together with a gate insulating layer 121, a source 120s and a drain 120d. The second driver gate 220 may constitute a second driver transistor TD2 together with a gate insulating layer 221, a source 220s and a drain 220d.

The source 110s of the first access transistor TA1 may be connected to the drain 120d of the first driver transistor TD1 and the source 210s of the second access transistor TA2 may be connected to the drain 220d of the second driver transistor TD2. The gates 110, 120, 210 and 220 may be simultaneously formed from a same material. Similarly, the gate insulating layers 111, 121, 211 and 221 may be formed from a same material at the same time.

Figure 7A:
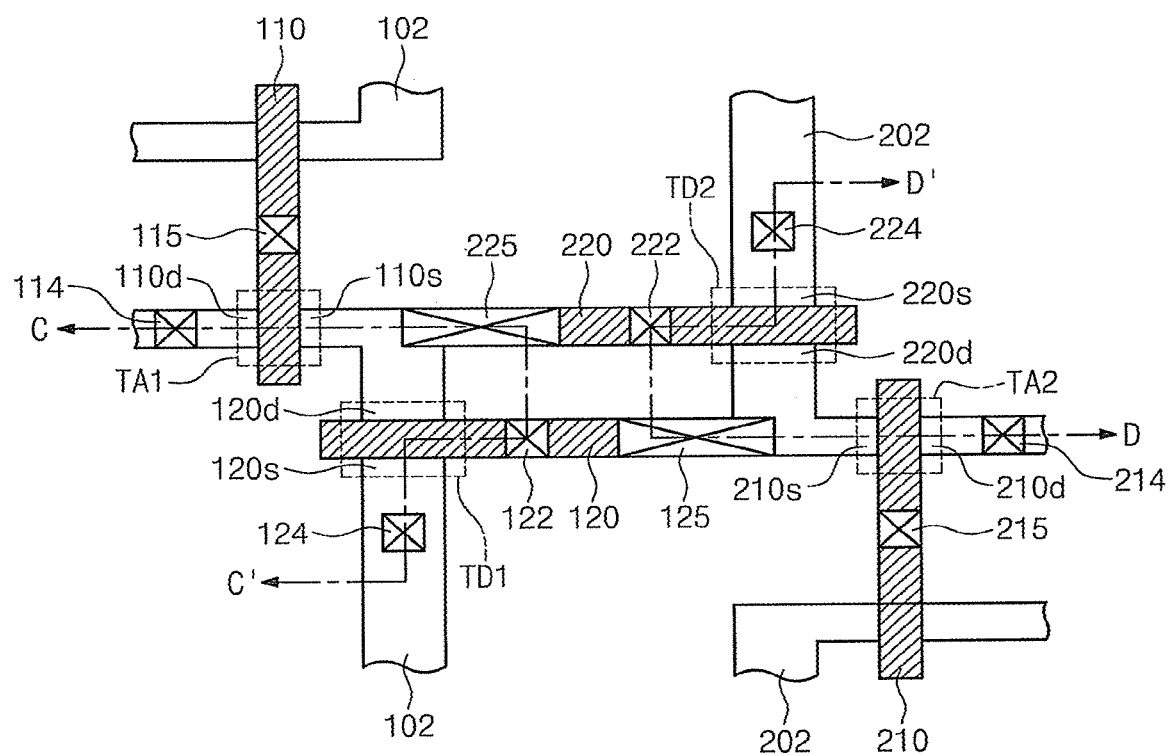

Referring to FIGS. 7A, 7B and 7C, multiple contacts may be formed by patterning of the first interlayer insulating layer 104 and a deposition of a conductive substance. For instance, a first bit line contact 114 and a second shared contact 225 connected to the drain 110d and the source 110s of the first access transistor TA1, respectively, and a first ground line contact 124 connected to the source 120s of the first driver transistor TD1 may be formed on the first active region 102. Also, a first word line contact 115 connected to the gate 110 of the first access transistor TA1 and a first contact 122 connected to the gate 120 of the first driver transistor TD1 may be formed on the first active region 102. The second shared contact 225 may also be connected to the gate 220 of the second driver transistor TD2.

Similarly, a second bit line contact 214 and a first shared contact 125 connected to the drain 210d and the source 210s of the second access transistor TA2, respectively, and a second ground line contact 224 connected to the source 220s of the second driver transistor TD2 may be formed on the second active region 202. Also, a second word line contact 215 connected to the gate 210 of the second access transistor TA2 and a second contact 222 connected to the gate 220 of the second driver transistor TD2 may be formed on the second active region 202. The first shared contact 125 may also be connected to the gate 120 of the first driver transistor TD1.

A silicide process may be further performed on the transistors in order to reduce a contact resistance between the contacts and the transistors. For instant, a metal silicide layer (e.g., $CoSi_x$) may be further formed by applying a silicide process to the gate 110, the drain 110d and the source 110s of the first access transistor TA1. The silicide process may also be applied to the first driver transistor TD1, the second access transistor TA2 and the second driver transistor TD2. The silicide process may be performed in a manner of self-alignment.

Figure 8A:
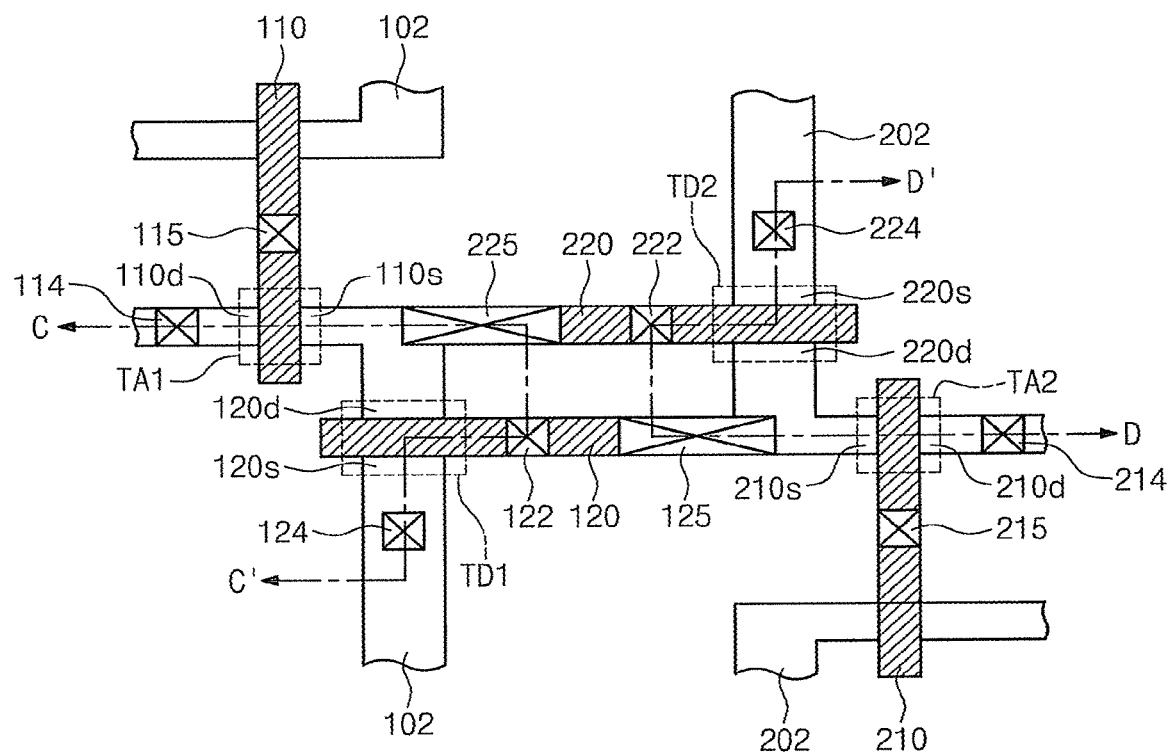
Figure 8B:
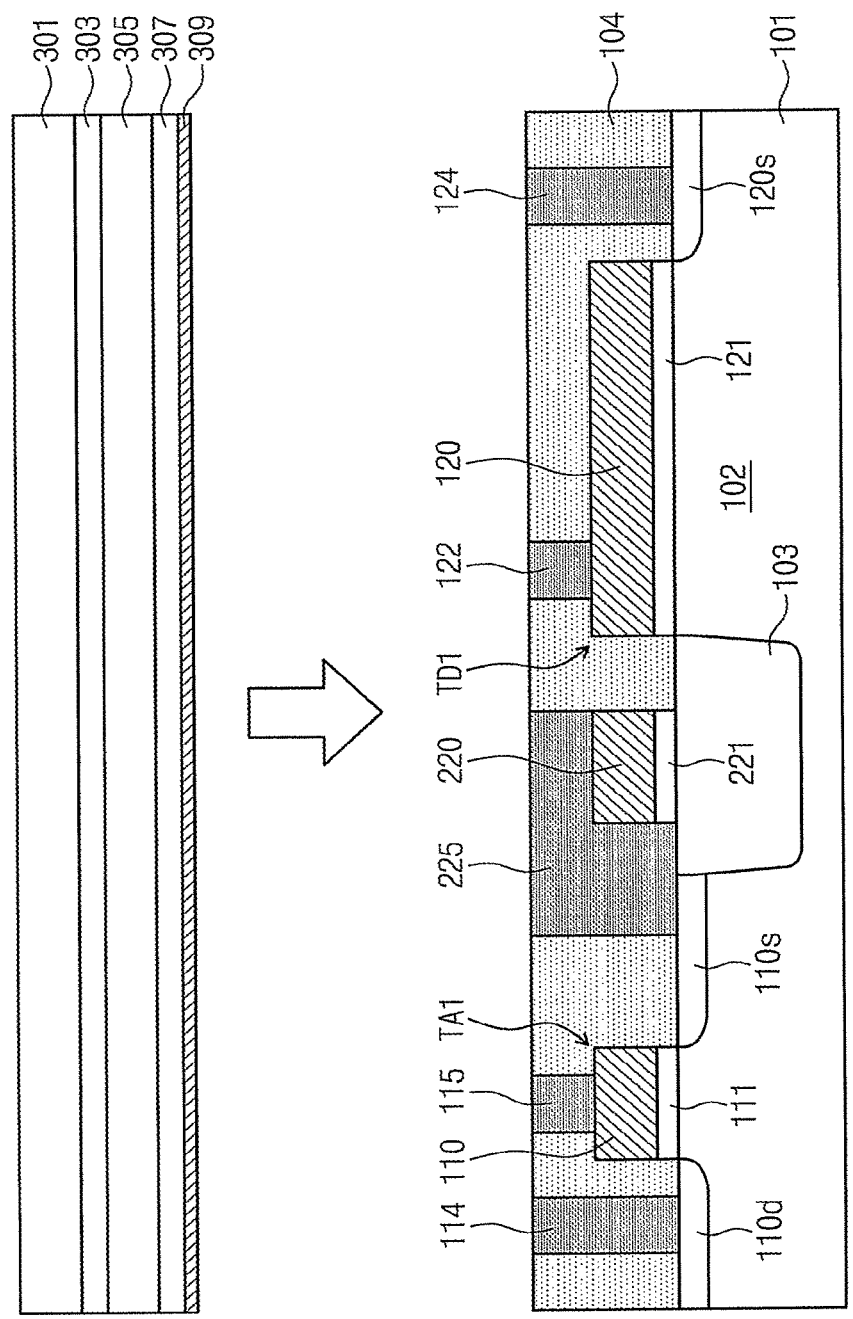
Figure 8C:
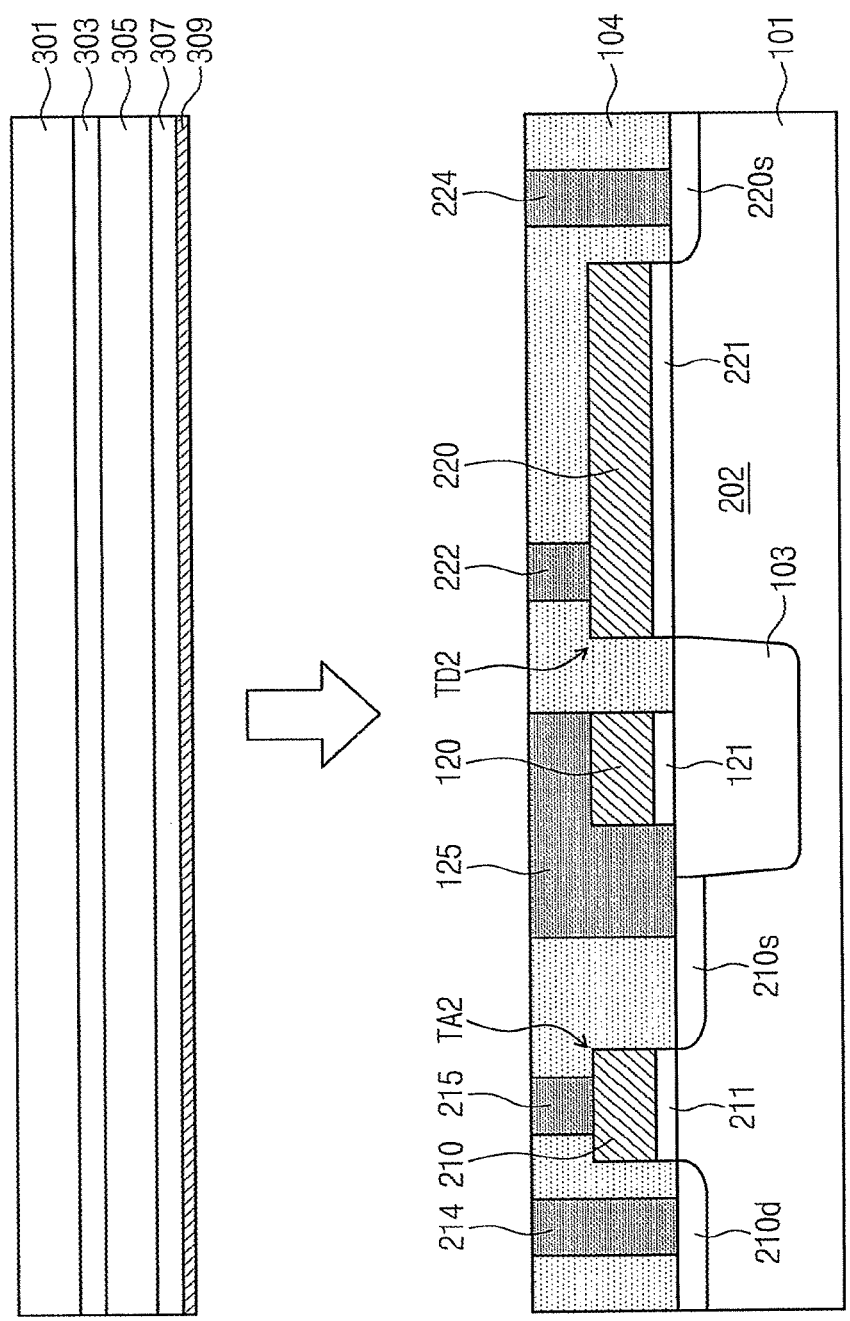

Referring to FIGS. 8A, 8B and 8C, a second substrate 301 for forming PMOS transistors of a vertical channel structure may adhere to the substrate 101 including four NMOS transistors TA1, TA2, TD1 and TD2. For instance, after forming a first semiconductor layer 303, a second semiconductor layer 305 and a third semiconductor layer 307 on the second substrate 301, the second substrate 301 may be turned upside down to adhere to the first interlayer insulating layer 104. The second substrate 301 may be a single crystalline silicon wafer, a polycrystalline silicon wafer or an amorphous silicon wafer.

As an illustration, the silicon wafer may be adopted as the second substrate 301 and a portion of the second substrate 301 may be transformed into the first through third semiconductors 303, 305 and 307 by an impurity ion implantation and high temperature activation. The first semiconductor layer 303 and the third semiconductor layer 307 may be formed to be a P-type semiconductor layer by a P-type impurity ion implantation and high temperature activation. The second semiconductor layer 305 may be formed to be an N-type semiconductor layer by an N-type impurity ion implantation and high temperature activation. In another illustration, the silicon wafer may be adopted as a second substrate 301 and the first through third semiconductor layers 303, 305 and 307 may be formed on the second substrate 301 by an epitaxial growth or a deposition. According to example embodiments, since the first through third semiconductor layers 303, 305 and 307 may be formed in the second substrate 301 by an impurity ion implantation, a mask may not be needed and the transistors formed in the second substrate 301 may have characteristics that are physically and electrically independent of the transistors formed in the substrate 101. Alternatively, a metal layer 309 may be further formed on the third semiconductor layer 307. The metal layer 309 may be formed by depositing metal or may be formed to be a metal silicide by performing a silicide process on the third semiconductor layer 307.

Figure 9A:
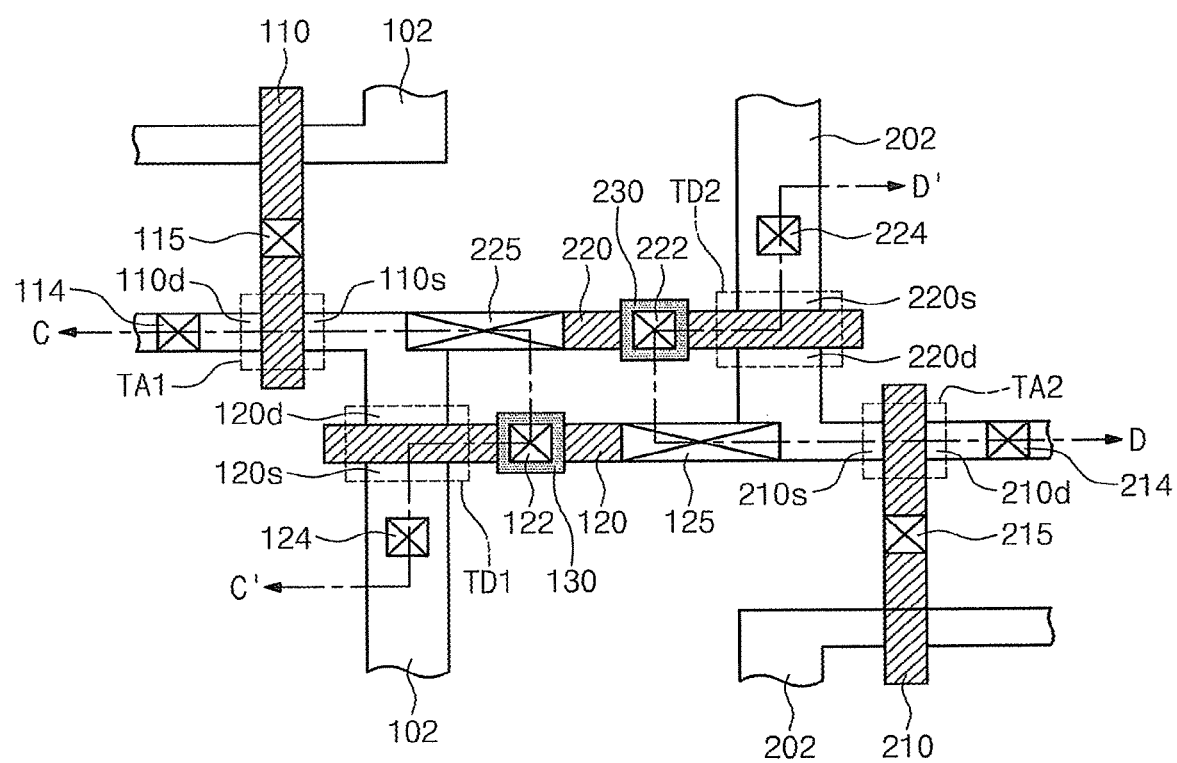
Figure 9B:
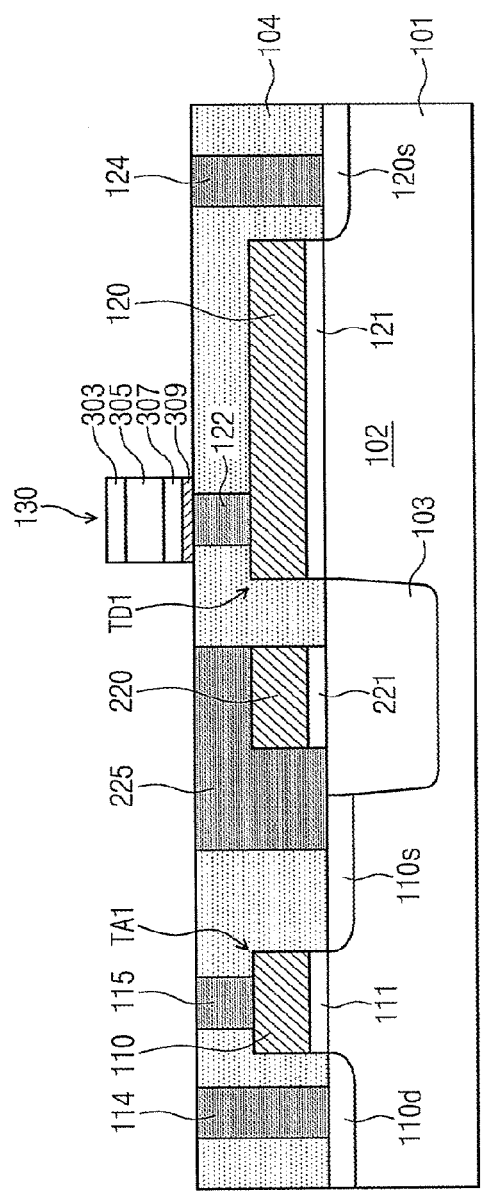
Figure 9C:
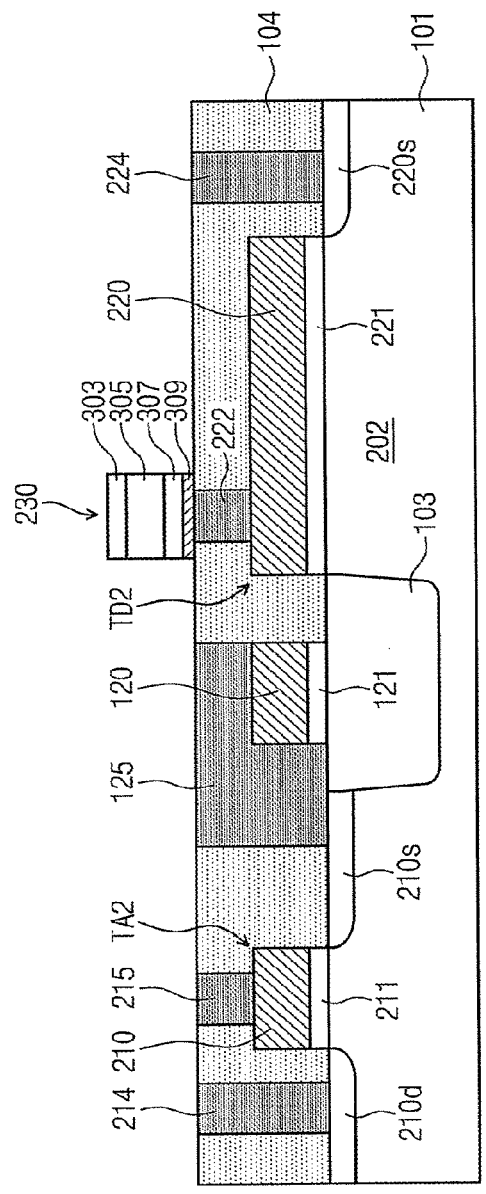

Referring to FIGS. 9A, 9B and 9C, a first vertical pillar 130 and a second vertical pillar 230 may be formed that are connected to the first contact 122 and the second contact 222, respectively. After the second substrate 301 described above is turned upside down to adhere to the first interlayer insulating layer 104, the vertical pillars 130 and 230 may be formed by performing a dry etching on the second substrate 301. The first vertical pillar 130 may have a laminated structure such that the third semiconductor layer 307, the second semiconductor layer 305 and the first semiconductor layer 303 are sequentially stacked. The first semiconductor 303 and the third semiconductor layer 307 may be used as a vertical source and a vertical drain, respectively, and the second semiconductor layer 305 may be used as a vertical channel. Similarly, the second vertical pillar 230 may have a laminated structure such that the third semiconductor layer 307 used as a vertical drain, the second semiconductor layer 305 used as a vertical channel and the first semiconductor layer 303 used as a vertical source are sequentially stacked. In the case that the first and second pillars 130 and 230 further include a metal layer 309, a resistance between the vertical drain 307 and the first contact 122 and a resistance between the vertical drain 307 and the second contact 222 may be lowered.

Figure 10A:
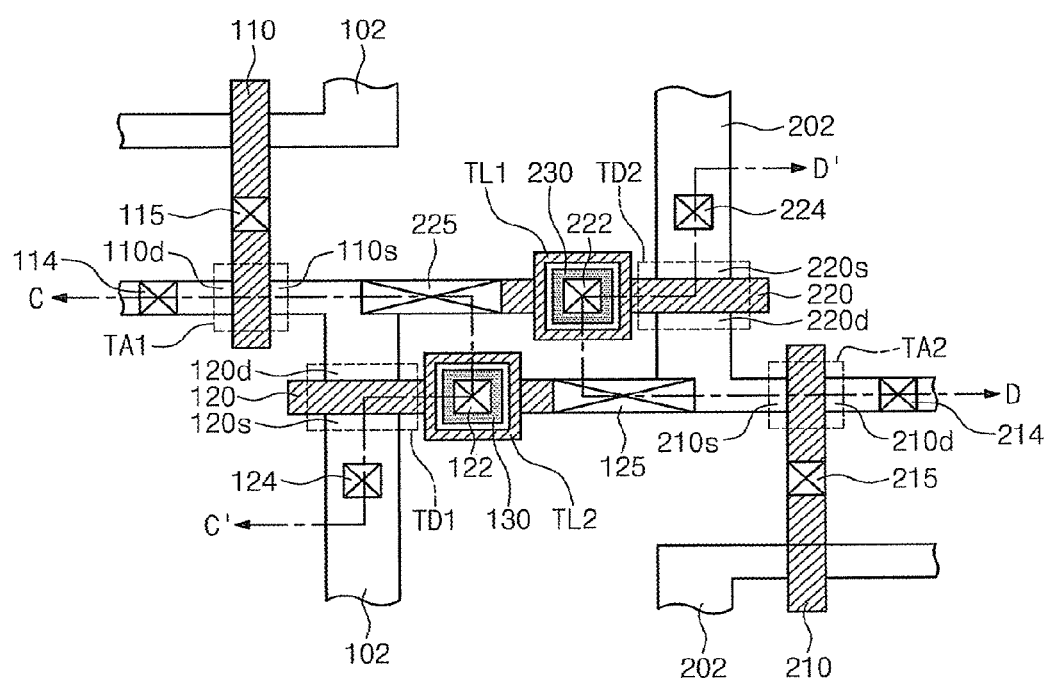
Figure 10B:
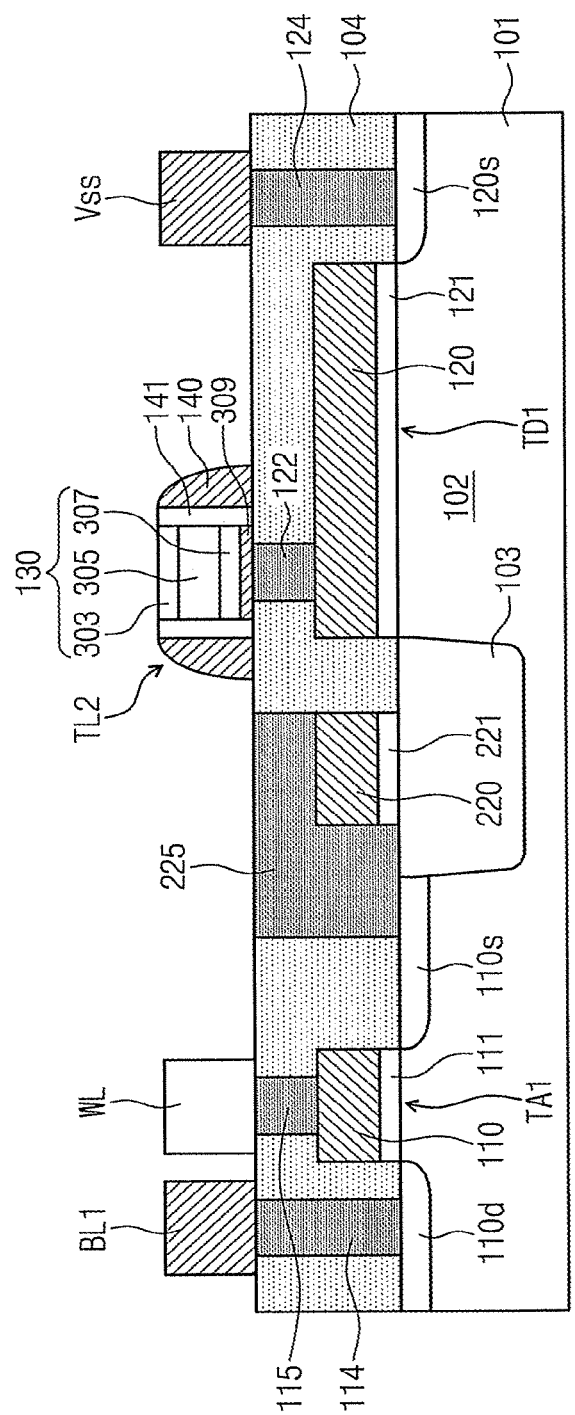
Figure 10C:
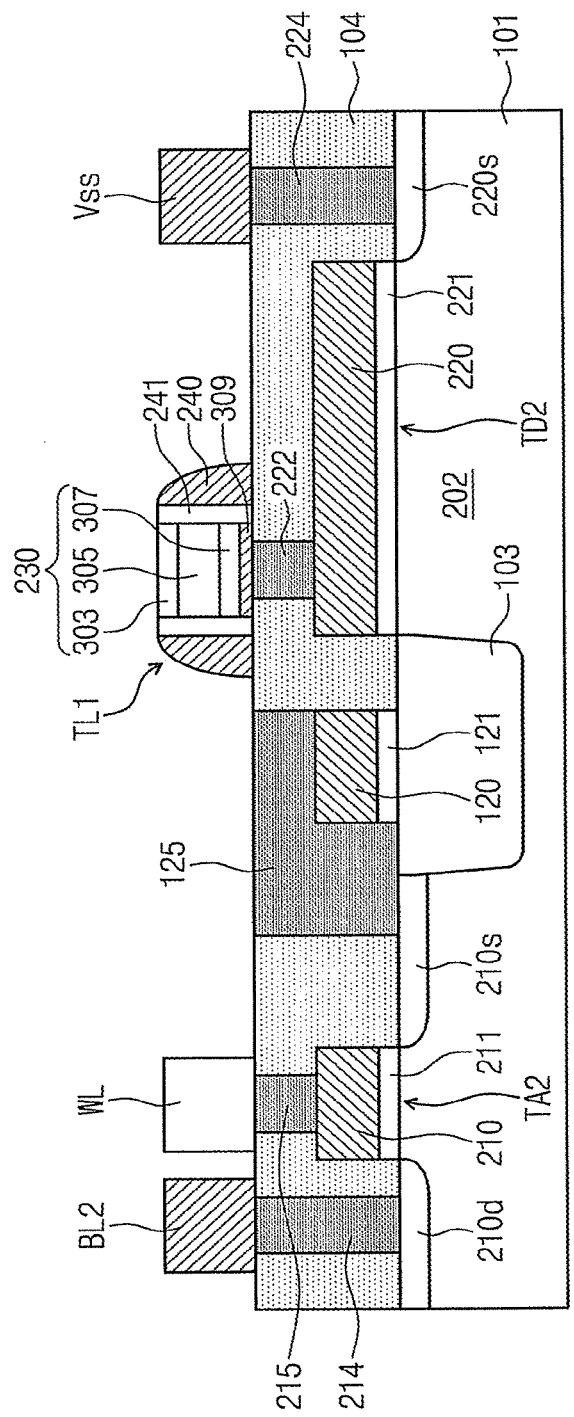
Figure 10D:
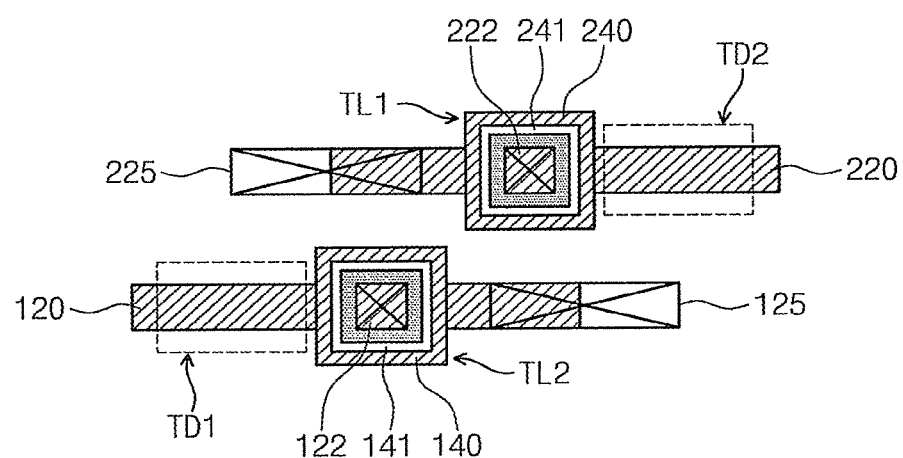
FIG. 10D is a top plan view illustrating a portion of FIG. 10A.

Referring to FIGS. 10A, 10B and 10C, a PMOS second load transistor TL2 connected to the first contact 122 and a PMOS first load transistor TL1 connected to the second contact 222 may be formed. A Top plan view of the second load transistor TL2 and the first load transistor TL1 is illustrated in FIG. 10D. The first load transistor TL1 and the second load transistor TL2 may be formed at the same time.

For example, a vertical gate insulating layer 141 and a vertical gate 140 may be formed on a sidewall of the first vertical pillar 130 by a deposition of an oxide layer (e.g., LTO) and a conductive layer (e.g., silicon, metal or combination thereof) and a dry etching thereof to form the second load transistor TL2 having a vertical channel structure. For another example, after the vertical gate insulating layer 141 is formed by a deposition of an oxide layer and a dry etching thereof, the vertical gate 140 may be formed by a deposition of a conductive layer and a dry etching thereof. The first vertical pillar may include the vertical source 303, the vertical channel 305 and the vertical drain 307 and the vertical gate 140 may be formed to have a surround gate structure surrounding the first vertical pillar 130.

Similarly, a vertical gate insulating layer 241 and a vertical gate 240 may be formed on a sidewall of the second vertical pillar 230 by a deposition of an oxide layer and a conductive layer and a dry etching thereof to form the first load transistor TL1 having a vertical channel structure. The vertical gate 240 may also be formed to have a surround gate structure surrounding the second vertical pillar 230. For another example, after the vertical gate insulating layer 241 is formed by a deposition of an oxide layer and a dry etching thereof, the vertical gate 240 may be formed by a deposition of a conductive layer and a dry etching thereof.

A first bit line BL1 connected to the first bit line contact 114, a word line WL connected to the first word line contact 115 and a ground line Vss connected to the first ground line contact 124 may be formed. These metal interconnections BL1, WL and Vss may be formed in concurrence with the second load transistor TL2. For instance, these metal interconnections BL1, WL and Vss may be formed when the vertical gate insulating layer 141 is formed on a sidewall of the first vertical pillar 130 and then the vertical gate 140 is formed by a deposition of a conductive layer and a dry etching thereof. Alternatively, these metal interconnections BL1, WL and Vss may be formed before or after the second load transistor TL2 is formed.

Similarly, a second bit line BL2 connected to the second bit line contact 214, a word line WL connected to the second word line contact 215 and a ground line Vss connected to the second ground line contact 224 may be formed. These metal interconnections BL2, WL and Vss may be formed before, after or in concurrence with the first load transistor TL1. Thus, the first access transistor TA1 and the second access transistor TA2 may be connected to a same word line WL through the first access gate 110 and the second access gate 210, respectively. The first driver transistor TD1 and the second driver transistor TD2 may be connected to a same ground line Vss through the source 120s and the source 220s, respectively. The first access transistor TA1 and the second access transistor TA2 may also be connected to the first bit line BL1 and the second bit line BL2 through the drain 110d and the drain 210d. These electrical connection structures may be understood in detail with reference to FIG. 1.

Figure 11A:
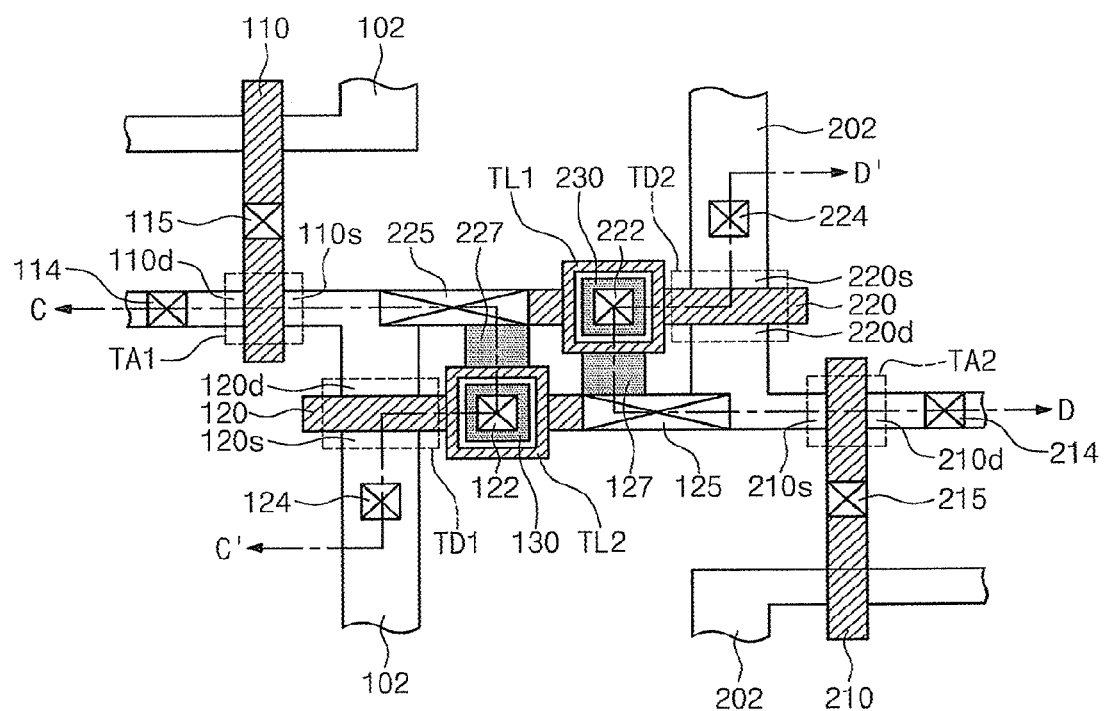
Figure 11B:
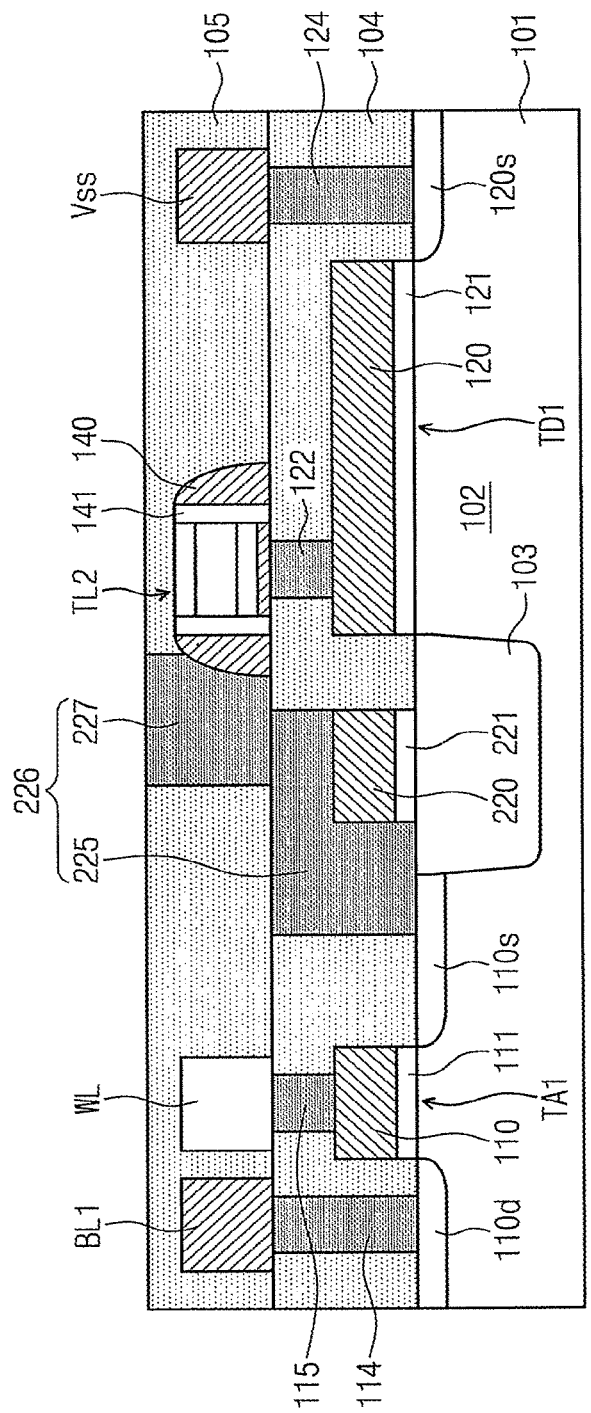
Figure 11C:
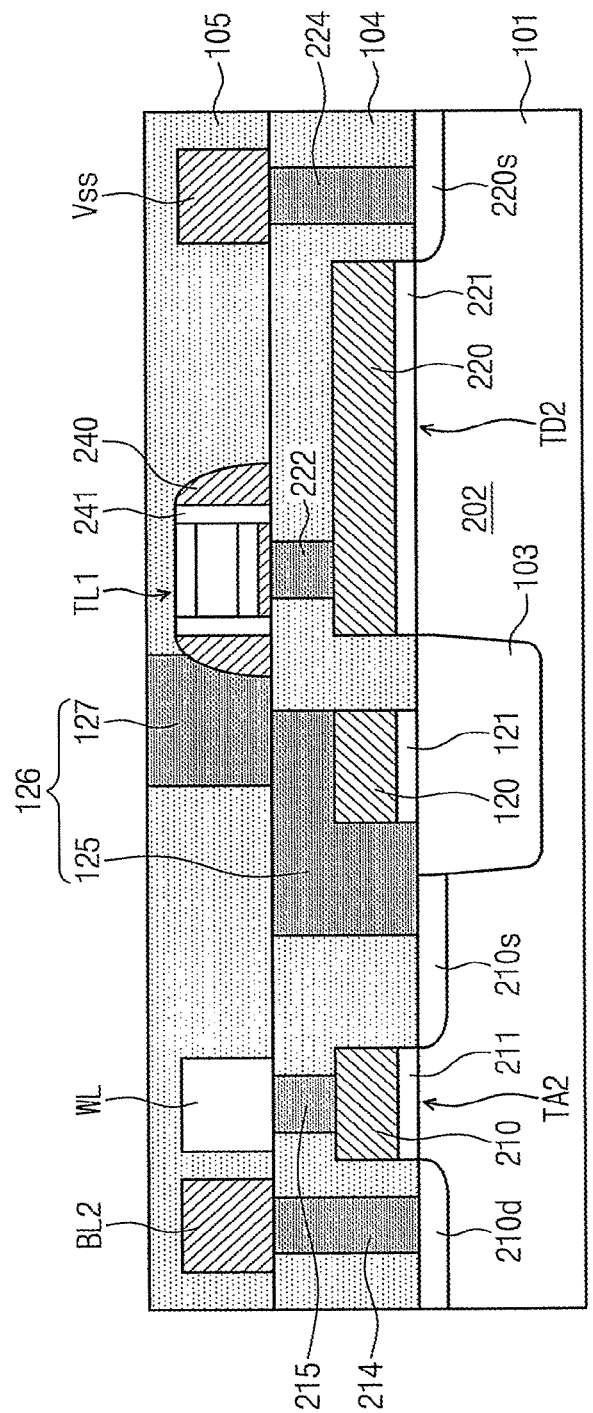
Figure 11D:
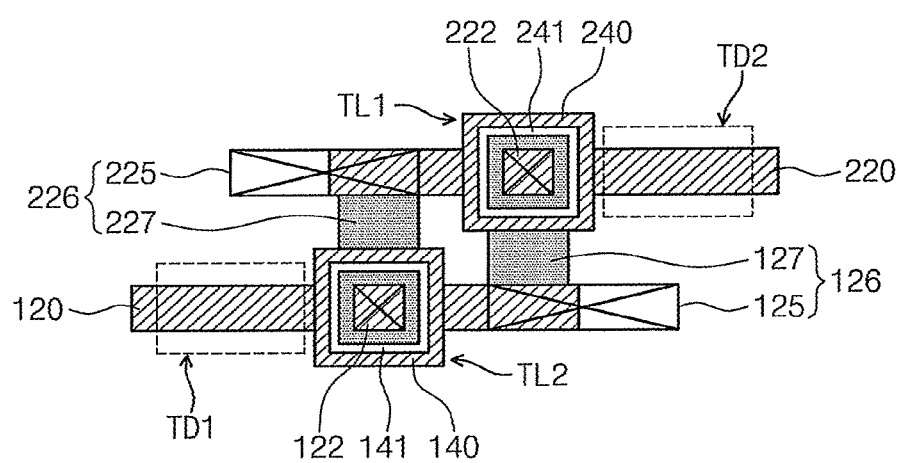
FIG. 11D is a top plan view illustrating a portion of FIG. 11A.

Referring to FIGS. 11A, 11B and 11C, a second interlayer insulating layer 105 covering the load transistors TL1 and TL2 and the metal interconnections BL1, BL2, WL and Vss may be formed by a deposition of an oxide layer. And then, a first serial via 126 that can serially connect the first load transistor TL1 to the first driver transistor TD1 and a second serial via 226 that can serially connect the second load transistor TL2 to the second driver transistor TD2 may be formed. A top plan view of an electrical connection of the second load transistor TL2 and the second serial via 226, and an electrical connection of the first load transistor TL1 and the first serial via 126 is illustrated in FIG. 11D.

For example, a second via 227 simultaneously connected to the vertical gate 140 of the second load transistor TL2 and the second shared contact 225 may be formed by a patterning of the second interlayer insulating layer 105 and a deposition of a conductive layer. The second via 227 may be combined with the second shared contact 225 to constitute the second serial via 226. Thus, the vertical gate 140 of the second load transistor TL2 and the gate 220 of the second driver transistor TD2 may be connected to each other through the second serial via 226.

Similarly, a first via 127 simultaneously connected to the vertical gate 240 of the first load transistor TL1 and the first shared contact 125 may be formed by a patterning of the second interlayer insulating layer 105 and a deposition of a conductive layer. The first via 127 may be combined with the first shared contact 125 to constitute the first serial via 126. Thus, the vertical gate 240 of the first load transistor TL1 and the gate 120 of the first driver transistor TD1 may be connected to each other through the first serial via 126.

Figure 12A:
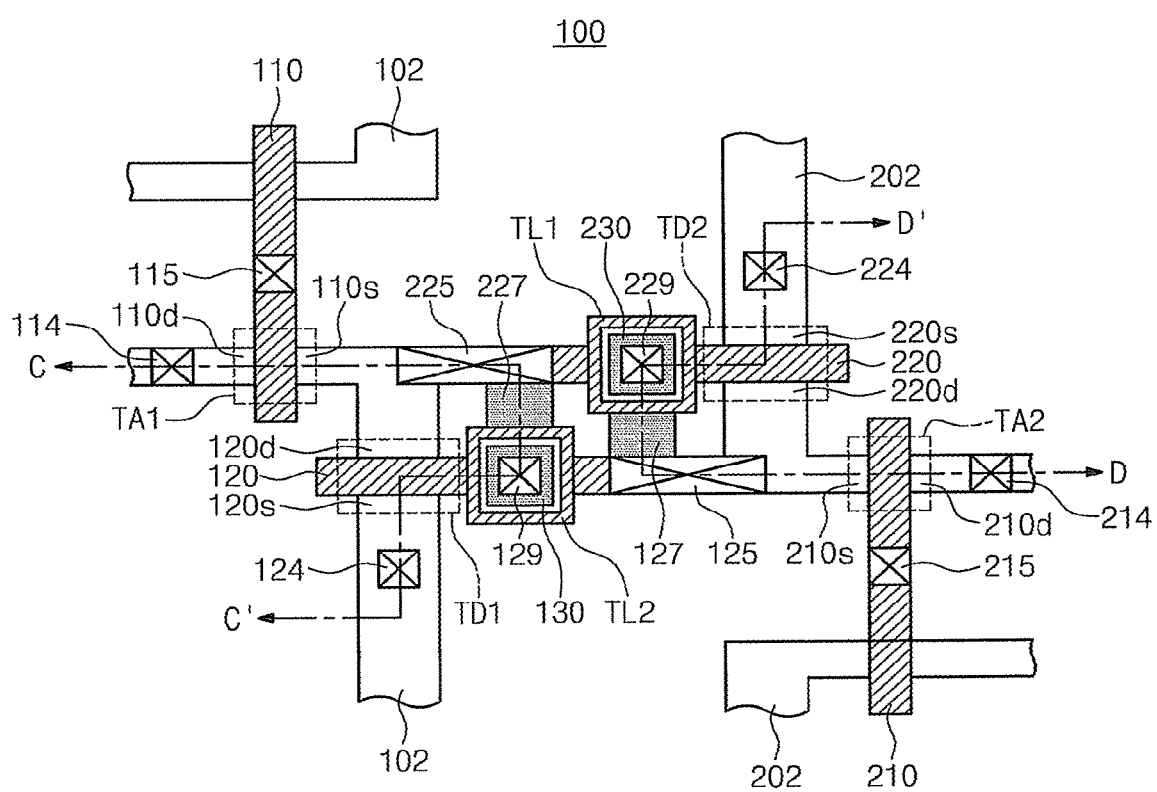
Figure 12B:
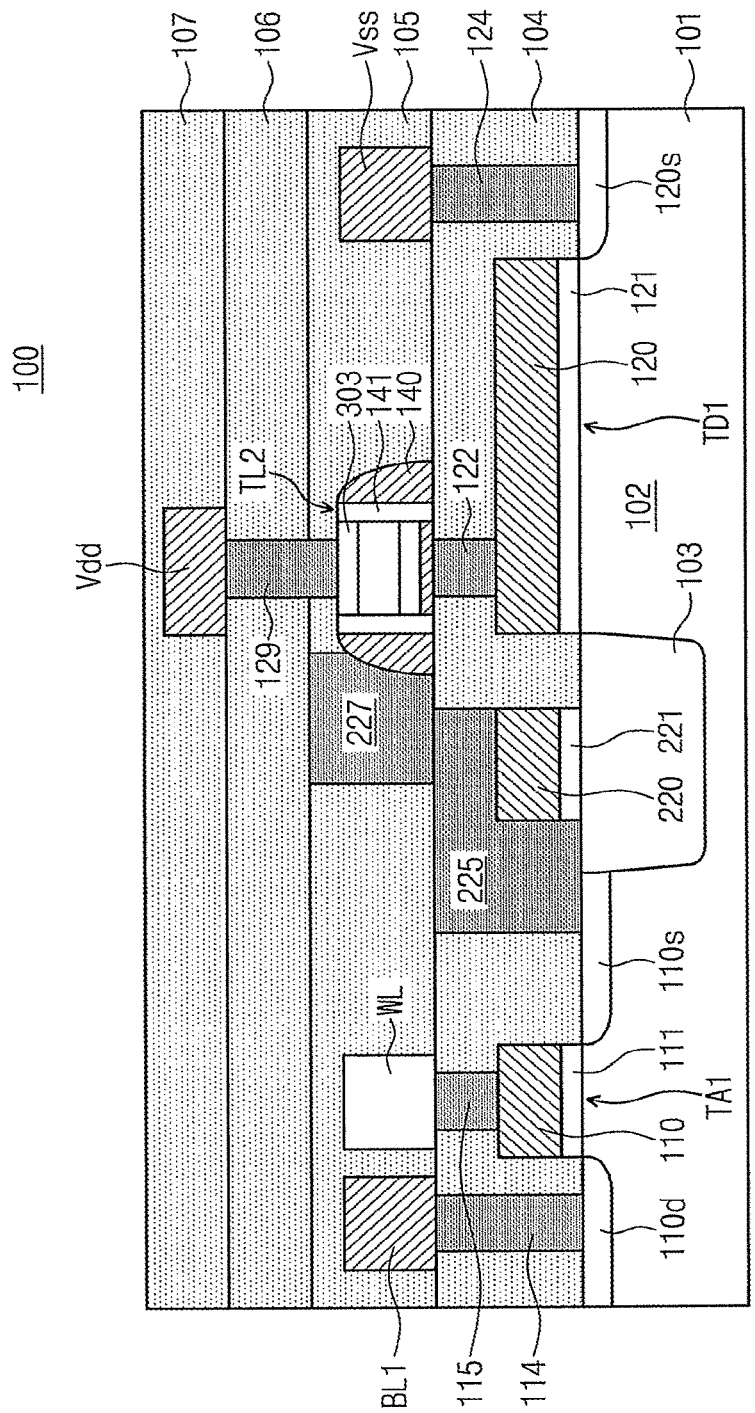
Figure 12C:
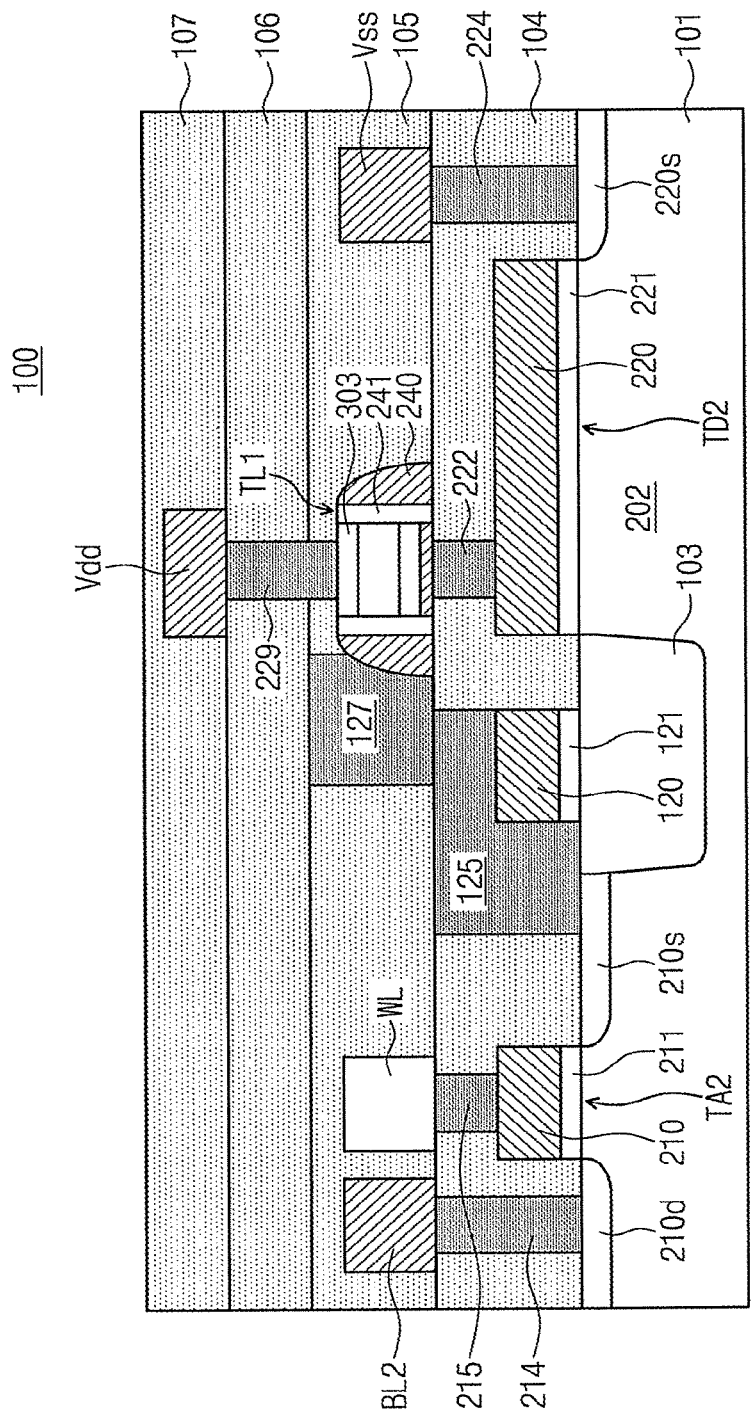

Referring to FIGS. 12A, 12B and 12C, a third interlayer insulating layer 106 covering the second interlayer insulating layer 105 may be formed. And then, a second power supply line contact 129 connected to the source 303 of the second load transistor TL2 and a first power supply line contact 229 connected to the source 303 of the first load transistor TL1 may be formed by a patterning of the third interlayer insulating layer 106 and a deposition of a conductive layer. A contact resistance between the sources 303 and the power supply line contacts 129 and 229 may be lowered by performing a silicide process on the sources 303 or further forming a metal layer on the sources 303. Subsequently, a power supply line Vdd connected to the first power supply line contact 229 and the second power supply line contact 129 may be formed and a fourth interlayer insulating layer 107 covering the power supply line Vdd may be formed. Since the power supply line Vdd is connected to the two power supply line contacts 129 and 229, the two load transistors TL1 and TL2 may be connected to a same power supply line Vdd. According to the series of processes, the SRAM device 100 may be embodied that includes the four NMOS transistors TA1, TA2, TD1 and TD2 on the substrate 101 and the two PMOS transistors TL1 and TL2 having a vertical channel structure over the substrate 101.

Figure 13:
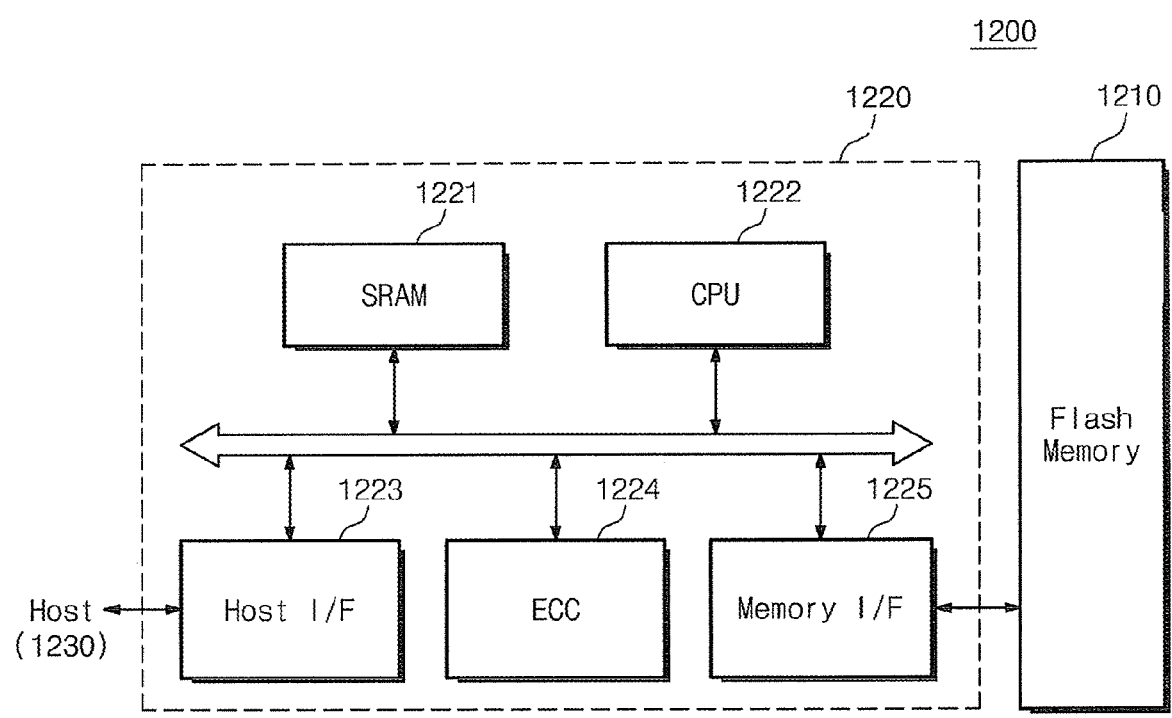
FIG. 13 is a block diagram illustrating a memory card including an SRAM device in accordance with example embodiments of the inventive concepts.

FIG. 13 is a block diagram illustrating a memory card including an SRAM device in accordance with example embodiments of the inventive concepts.

Referring to FIG. 13, a memory card 1200 may be a device for supporting a storage capacity of large amounts of data and may include a flash memory 1210. The memory card 1200 may include a memory controller 1220 controlling all the data exchanges between a host 1230 and the flash memory 1210. A SRAM 1221 may be used as an operation memory of a central processing unit (CPU) 1222 and may be based on example embodiments of the inventive concepts. A host interface 1223 may include a data exchange protocol of the host 1230 connected to the memory card 1200. An error correction code (ECC) 1224 may detect and correct an error included in data readout from the flash memory 1210. The memory interface 1225 may interface with the flash memory 1210. The central processing unit (CPU) 1222 may perform all the controlling operations for a data exchange of the memory controller 1220. Although not illustrated in the drawing, the memory card may further include a ROM storing code data for interfacing with the host 1230.

According to example embodiments of the inventive concepts, an integration of SRAM device may be improved by stacking two PMOS transistors on four NMOS transistors. Also, the number of masks may be reduced and compatibility with a logic process may be excellent by attaching a stack wafer on a bulk silicon wafer to embody PMOS transistors. Although example embodiments have been described in terms of specific embodiments, the present invention is not intended to be limited by example embodiments as described herein. Thus, the scope may be determined by the following claims.

What is claimed is:

1. An SRAM device, comprising:
a first access transistor, a second access transistor, a first driver transistor, and a second driver transistor on a first substrate;
a first load transistor on the second driver transistor and a second load transistor on the first driver transistor;
a first shared contact electrically connecting a gate of the first load transistor to a source of the second access transistor and electrically connecting the gate of the first load transistor to a gate of the first driver transistor;
a second shared contact electrically connecting a gate of the second load transistor to a source of the first access transistor and electrically connecting the gate of the second load transistor to a gate of the second driver transistor;
a first contact between the second load transistor and the gate of the first driver transistor to electrically connect the second load transistor to the first driver transistor; and
a second contact between the first load transistor and the gate of the second driver transistor to electrically connect the first load transistor to the second driver transistor, wherein the first access transistor, the second access transistor, the first driver transistor, and the second driver transistor are configured to operate horizontally and the first and second load transistors are configured to operate vertically.

2. The SRAM device of claim 1, wherein the first shared contact is on a side and a top of the gate of the first driver transistor and the second shared contact is on a top and a side of the gate of the second driver transistor.

3. The SRAM device of claim 2, wherein
the first load transistor includes a first gate surrounding a first channel arranged between a first source and a first drain, and
the second load transistor includes a second gate surrounding a second channel arranged between a second source and a second drain.

4. The SRAM device of claim 3, further comprising:
a first via electrically connecting the first shared contact to the first gate of the first load transistor; and
a second via electrically connecting the second shared contact to the second gate of the second load transistor.

5. The SRAM device of claim 1, further comprising:
a first bit line electrically connected to a drain of the first access transistor;
a second bit line electrically connected to a drain of the second access transistor;
a wordline electrically connected gates of the first and second access transistors;
a power supply line electrically connected to the first and second load transistors; and
a ground line electrically connected to sources of the first and second driver transistors.

* * * * *